United States Patent
Kim

(10) Patent No.: US 9,299,812 B2
(45) Date of Patent: Mar. 29, 2016

(54) METHOD OF FORMING SEMICONDUCTOR DEVICE HAVING STRESSOR

(71) Applicant: SAMSUNG ELECTRONICS CO., LTD., Suwon-Si, Gyeonggi-Do (KR)

(72) Inventor: Jun-Suk Kim, Goyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/591,465

(22) Filed: Jan. 7, 2015

(65) Prior Publication Data
US 2015/0263138 A1    Sep. 17, 2015

(30) Foreign Application Priority Data

Mar. 13, 2014    (KR) .................. 10-2014-0029760

(51) Int. Cl.
*H01L 29/66*    (2006.01)
*H01L 21/306*    (2006.01)
*H01L 29/78*    (2006.01)
*H01L 21/8234*    (2006.01)
*H01L 29/165*    (2006.01)

(52) U.S. Cl.
CPC .... *H01L 29/66818* (2013.01); *H01L 21/30604* (2013.01); *H01L 21/823412* (2013.01); *H01L 21/823425* (2013.01); *H01L 21/823431* (2013.01); *H01L 29/6656* (2013.01); *H01L 29/66545* (2013.01); *H01L 29/7848* (2013.01); *H01L 29/165* (2013.01)

(58) Field of Classification Search
CPC ...................... H01L 29/66818; H01L 29/6656; H01L 29/7848; H01L 29/161; H01L 29/165
See application file for complete search history.

(56) References Cited

U.S. PATENT DOCUMENTS

| 7,906,830 | B2 | 3/2011 | Wells et al. |
| 8,071,481 | B2 | 12/2011 | Kao et al. |
| 8,148,780 | B2 | 4/2012 | Tang et al. |
| 8,313,999 | B2 | 11/2012 | Cappellani et al. |
| 8,455,313 | B1 | 6/2013 | Basker et al. |
| 2011/0117732 | A1* | 5/2011 | Bauer ............... H01L 21/02381 438/507 |
| 2011/0147842 | A1* | 6/2011 | Cappellani ........ H01L 21/26506 257/365 |
| 2011/0193164 | A1* | 8/2011 | Zhu ................... H01L 29/66795 257/347 |
| 2011/0248348 | A1 | 10/2011 | Gan et al. |
| 2013/0092984 | A1 | 4/2013 | Liu et al. |
| 2013/0099282 | A1 | 4/2013 | Chen et al. |
| 2013/0164890 | A1 | 6/2013 | Basker et al. |
| 2013/0228862 | A1 | 9/2013 | Lee et al. |
| 2013/0248943 | A1 | 9/2013 | Wells et al. |
| 2014/0191298 | A1* | 7/2014 | Chen ..................... H01L 29/401 257/288 |
| 2015/0140787 | A1* | 5/2015 | Zhang ............... H01L 21/30604 438/478 |

* cited by examiner

*Primary Examiner* — Mamadou Diallo
(74) *Attorney, Agent, or Firm* — Volentine & Whitt, PLLC

(57) ABSTRACT

Provided are methods of forming a semiconductor device having an embedded stressor. The method includes forming a fin active area on a substrate. A gate structure configured to cross the fin active area and cover a side surface of the fin active area, and a gate spacer on a sidewall of the gate structure are formed. Preliminary trenches are formed in the fin active area adjacent to both sides of the gate structure using an anisotropic etching process. An etching select area is formed by oxidizing the fin active area exposed to the preliminary trenches. Trenches are formed by removing the etching select area. A stressor is formed in each of the trenches.

20 Claims, 18 Drawing Sheets

METHOD OF FORMING SEMICONDUCTOR DEVICE HAVING STRESSOR

CROSS-REFERENCE TO RELATED APPLICATION

A claim of priority under 35 U.S.C. §119 is made to Korean Patent Application No. 10-2014-0029760 filed on Mar. 13, 2014, the entire contents of which are hereby incorporated by reference.

BACKGROUND

The present inventive concept relates to a method of forming a semiconductor device having an embedded stressor and a related device. Various strain technologies for improving the electrical characteristics of a semiconductor device have been studied, and the inventive concept is consequently related to improving electrical characteristics of semiconductor devices.

SUMMARY

Embodiments of the inventive concept provide a method of manufacturing a semiconductor device having an embedded stressor. Other embodiments of the inventive concept provide a semiconductor device having an embedded stressor.

In accordance with example embodiments of the inventive concept, a method of forming a semiconductor device may include forming a fin active area on a substrate, forming a gate structure configured to cross the fin active area and cover a side surface of the fin active area, and a gate spacer on a sidewall of the gate structure, forming trenches in the fin active area adjacent to both sides of the gate structure, and forming stressors in the trenches. The formation of the trenches may include forming preliminary trenches by anisotropically etching the fin active area, forming an etching select area by oxidizing the fin active area exposed to the preliminary trenches, and removing the etching select area.

In some embodiments of the inventive concept, the formation of the etching select area may include a radical oxidation process.

In some embodiments of the inventive concept, the formation of the trench may include forming the preliminary trenches by anisotropically etching the fin active area and then performing a process of forming the etching select area in the fin active area and a process of removing the etching select area two or more times.

In some embodiments of the inventive concept, each of the trenches may have a U-shape.

In some embodiments of the inventive concept, halo areas configured to cover the stressors may be formed in the fin active area.

In some embodiments of the inventive concept, sidewalls of the trenches may be arranged under the gate spacer, and may have a substantially vertical profile.

In some embodiments of the inventive concept, one of the sidewalls of the trenches may be selected, and first to fourth quadrant points may be defined on the selected sidewall thereof. The fourth quadrant point may be located on an upper corner of the fin active area. The second quadrant point may be located on a horizontal line passing through a vertical bisection point between a bottom and an upper end of the trench. A straight line passing through the second quadrant point and the third quadrant point may be substantially perpendicular to a surface of the substrate.

In some embodiments of the inventive concept, the fourth quadrant point may be located on the straight line passing through the second quadrant point and the third quadrant point.

In some embodiments of the inventive concept, the fourth quadrant point may be spaced apart from the straight line passing through the second quadrant point and the third quadrant point. The fourth quadrant point may be closer to a center of the gate structure than the second quadrant point and the third quadrant point.

In some embodiments of the inventive concept, the formation of the stressors may include forming a first semiconductor layer in the trenches, forming a second semiconductor layer on the first semiconductor layer, and forming a third semiconductor layer on the second semiconductor layer. The first semiconductor layer and the second semiconductor layer may include a different material from the fin active area.

In some embodiments of the inventive concept, the first semiconductor layer, the second semiconductor layer, and the third semiconductor layer may be formed by a selective epitaxial growth (SEG) method.

In some embodiments of the inventive concept, the first semiconductor layer and the second semiconductor layer may include a SiGe. A Ge content in the second semiconductor layer may be greater than that in the first semiconductor layer. The third semiconductor layer may include an Si.

In some embodiments of the inventive concept, the forming of the etching select area includes a thermal oxidation process.

In accordance with example embodiments of the inventive concept, a method of forming a semiconductor device may include forming an active area on a substrate, forming a gate structure configured to cross the active area, forming trenches in the active area adjacent to both sides of the gate structure, and forming stressors in the trenches. The formation of the trenches may include forming preliminary trenches by anisotropically etching the active area, forming an etching select area in the preliminary trenches by oxidizing the active area using a radical oxidation process, and removing the etching select area.

In some embodiments of the inventive concept, sidewalls of the trenches may have a profile substantially perpendicular to a surface of the substrate.

In some embodiments of the inventive concept, the formation of the trench may include forming the preliminary trenches by anisotropically etching the active area and then performing a process of forming the etching select area in the active area by the radical oxidation process and a process of removing the etching select area two or more times.

In some embodiments of the inventive concept, each of the trenches may have a U-shape.

In accordance with example embodiments of the inventive concept, a method of forming a semiconductor device may include forming an fin active area on a substrate, forming a gate structure configured to cross the fin active area, forming preliminary trenches in the fin active area adjacent to both sides of the gate structure, forming the trenches by performing a process one or more times, the process including forming an etching select area in the preliminary trenches by oxidizing the fin active area using a radical oxidation process and removing the etching select area, and forming a stressor in each of the trenches.

In some embodiments of the inventive concept, sidewalls of the trenches may have a profile substantially perpendicular to a surface of the substrate.

In some embodiments of the inventive concept, sidewalls of the stressor may have a profile substantially perpendicular to a surface of the substrate.

BRIEF DESCRIPTION OF THE DRAWINGS

The foregoing and other features and advantages of the inventive concept will be apparent from the more particular description of embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION

Figure 1:
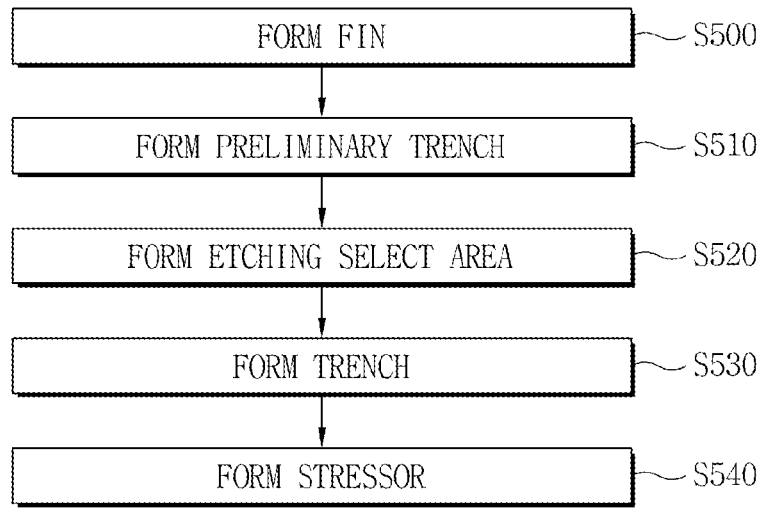
FIG. 1 is a flowchart for describing a method of forming a semiconductor device in accordance with example embodiments of the inventive concept.

Various embodiments will now be described more fully with reference to the accompanying drawings in which some embodiments are shown. These inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The exemplary embodiments of the inventive concept will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the inventive concept are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the inventive concept.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Terms such as "front side" and "back side" may be used in a relative sense herein to facilitate easy understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Figure 2:
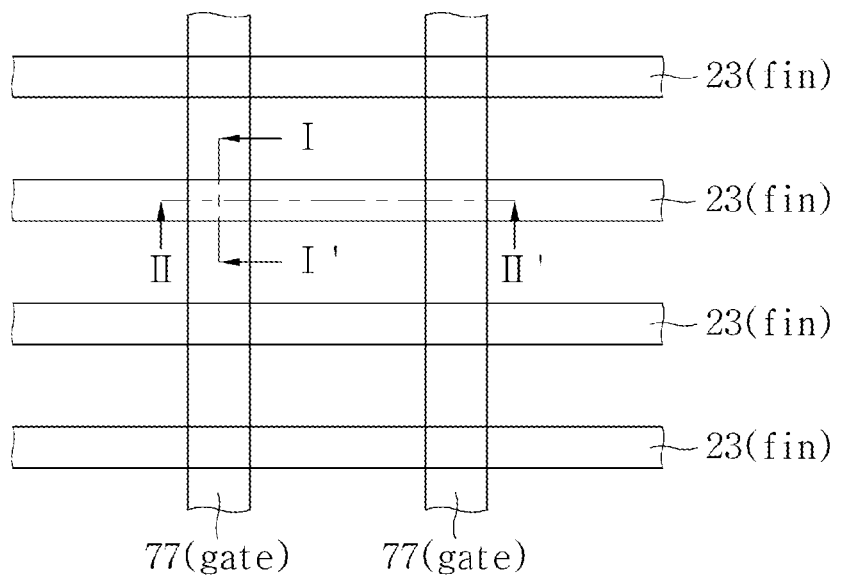
FIG. 2 is a layout for describing a method of forming a semiconductor device in accordance with example embodiments of the inventive concept.
Figure 22:
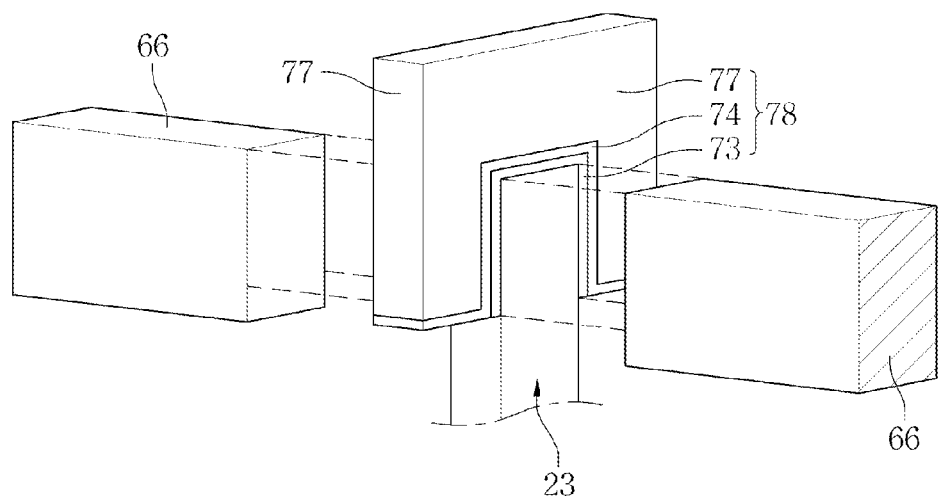
FIGS. 22 and 23 are perspective views for describing a semiconductor device in accordance with example embodiments of the inventive concept.
Figure 23:
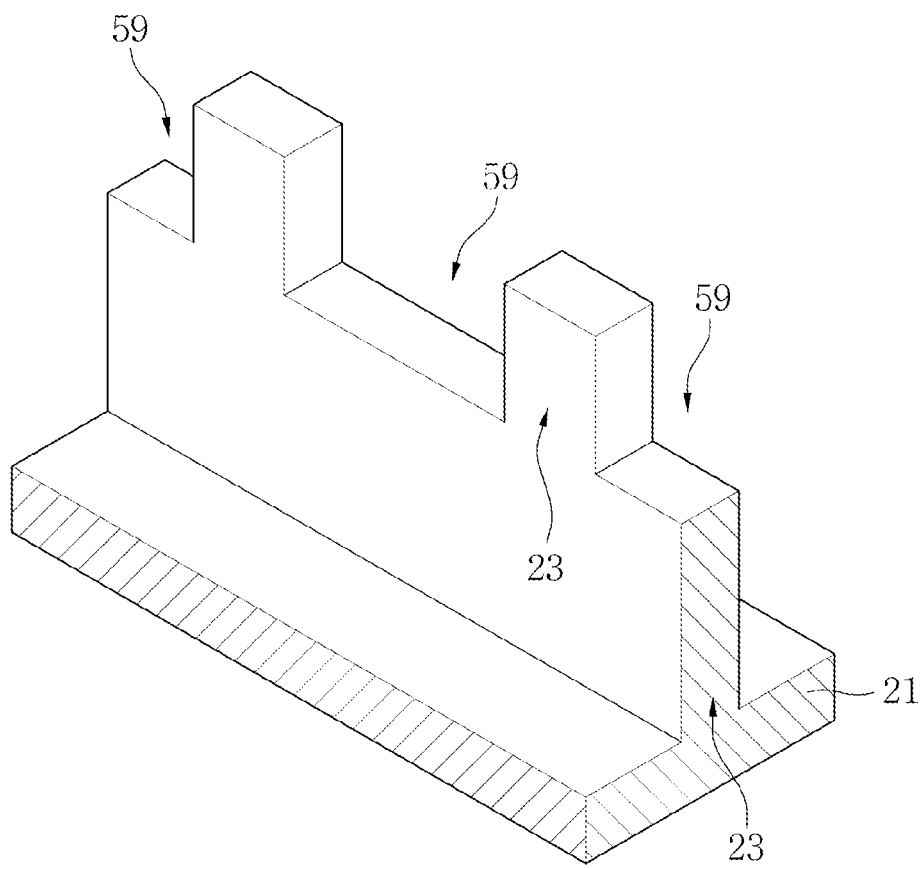
Figure 24:
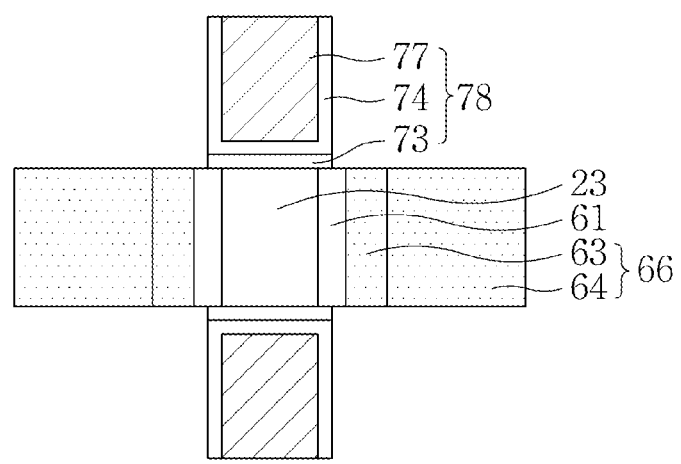
FIG. 24 is a cross-sectional view showing a part of FIG. 21.

FIG. 1 is a flowchart for describing a method of forming a semiconductor device in accordance with example embodiments of the inventive concept, FIG. 2 is a layout for describing a method of forming a semiconductor device in accordance with example embodiments of the inventive concept, and FIGS. 3 to 13 and 15 to 21 are cross-sectional views taken along lines I-I' and II-II' shown in FIG. 2 for describing a method of forming a semiconductor device in accordance with example embodiments of the inventive concept. FIG. 14 is an enlarged view showing a part of FIG. 13 in detail. FIGS. 22 and 23 are perspective views for describing a semiconductor device in accordance with example embodiments of the inventive concept, and FIG. 24 is a cross-sectional view showing a part of FIG. 21.

Referring to FIG. 1, a method of forming a semiconductor device in accordance with example embodiments of the inventive concept may include forming a fin (S500), forming a preliminary trench in the fin (S510), forming an etching select area adjacent to the preliminary trench (S520), forming a trench by etching the etching select area (S530), and forming a stressor in the trench (S540). Details will be described with reference to the drawings based on processes below.

Figure 3:
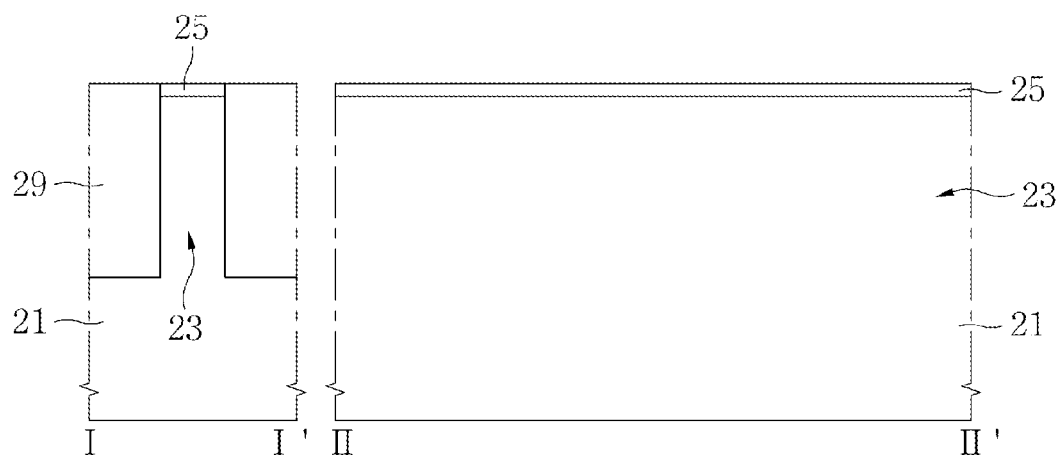
FIGS. 3, 4, 5, 6, 7, 8, 9, 10, 11, 12 and 13, and FIGS. 15, 16, 17, 18, 19, 20 and 21 are cross-sectional views taken along lines I-I' and II-II' shown in FIG. 2, and are for describing a method of forming a semiconductor device in accordance with example embodiments of the inventive concept.

Referring to FIGS. 1, 2, and 3, an isolation layer 29, which defines an active area 23, may be formed on a substrate 21 (S500). The active area 23, for example, comprise a fin protruding at an upper portion of the substrate 21 and extending longitudinally in a give direction (to the left and right in FIG. 2). That is, the active area 23, may be a fin active area. An upper surface of the active area 23 may be covered with a buffer layer 25. The buffer layer 25 may be omitted.

The substrate 21 may be a semiconductor substrate such as a silicon wafer or a silicon on insulator (SOI) wafer. For example, the substrate 21 may include single-crystalline silicon having a P-type impurity. The active area 23 may have a fin shape in which a length of major axis is formed relatively long, however, it is not limited thereto, and it may have various shapes such as a wire shape, and so on. The fin active area 23 may include a semiconductor material. For example, the fin active area 23 may include single-crystalline silicon. A height of the fin active area 23 may be greater than a width thereof.

The isolation layer 29 may be formed using a shallow trench isolation (STI) technique. The isolation layer 29 may include an insulating layer such as silicon oxide, silicon nitride, silicon oxynitride, or a combination thereof. The buffer layer 25 may include an insulating layer such as silicon oxide, silicon nitride, silicon oxynitride, or a combination thereof.

Figure 4:
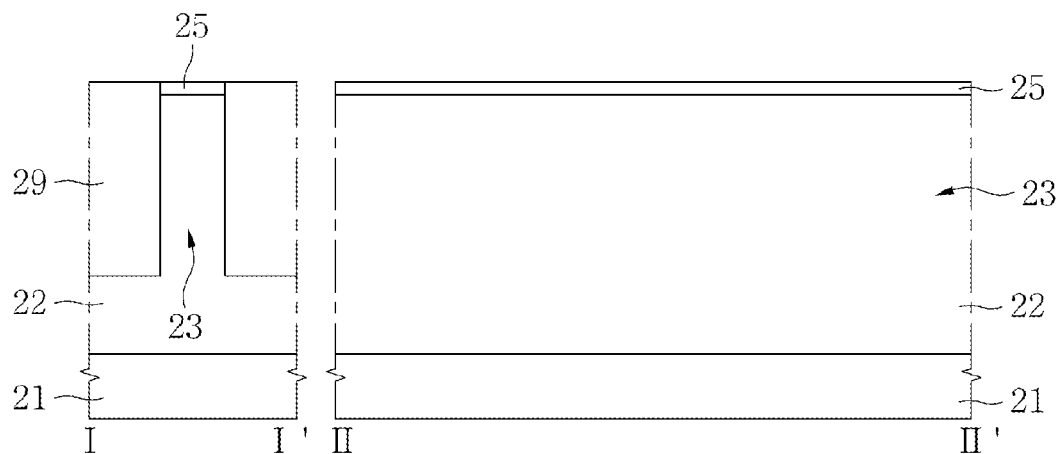

Referring to FIGS. 1, 2, and 4, a well may be formed on a predetermined area of the substrate 21. For example, the well may be an N-well 22. The fin active area 23 may be confined to the N-well 22. Channel ions may be implanted into the fin active area 23. The fin active area 23 may include impurities of the same type as the N-well 22. The N-well 22 may be formed by implanting impurities of a different conductive type from the substrate 21. For example, the N-well 22 may be formed by implanting N-type impurities at a predetermined depth from a surface of the substrate 21. The substrate 21 may include boron (B), and the N-well 22 may include arsenic (As), phosphorus (P), or a combination thereof.

In some embodiments, the N-well 22 may be formed before forming the isolation layer 29. The N-well 22 may be omitted.

Figure 5:
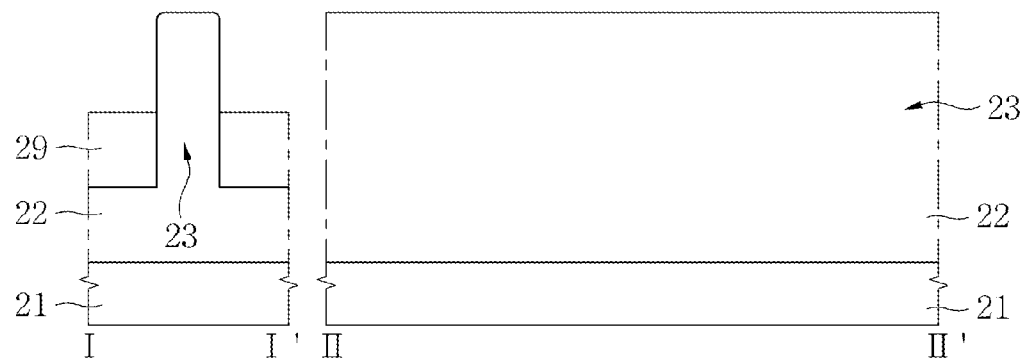

Referring to FIGS. 1, 2, and 5, the isolation layer 29 may be recessed, and side surfaces of the fin active area 23 may be exposed. For example, the isolation layer 29 may be recessed by applying an etch-back process. An upper surface of the isolation layer 29 may be at a lower level than an upper surface of the fin active area 23. The buffer layer 25 may also be removed while the isolation layer 29 is recessed. An upper surface of the fin active area 23 may be exposed.

Figure 6:
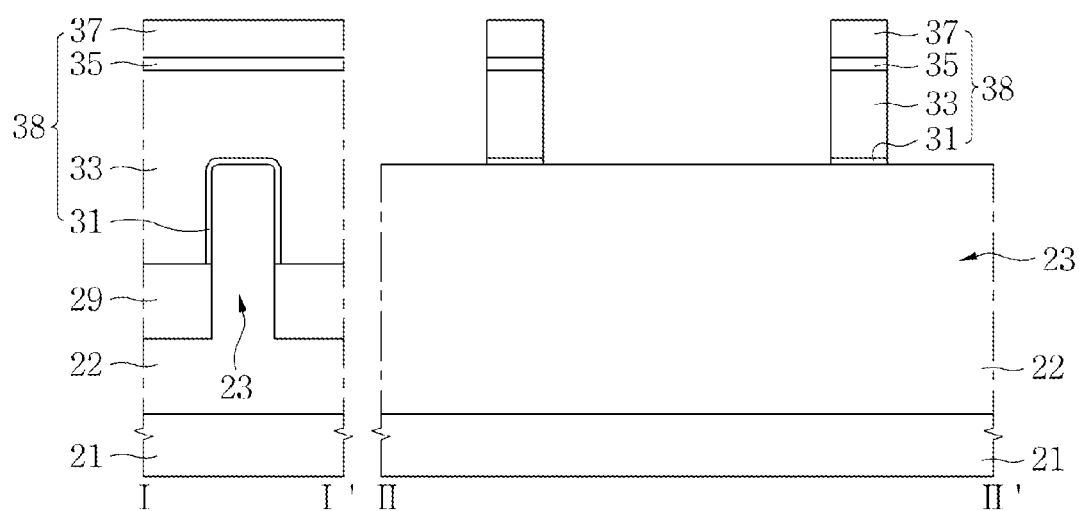

Referring to FIGS. 1, 2, and 6, a preliminary dielectric layer 31, a preliminary gate electrode 33, a buffer pattern 35, and a mask pattern 37 may be formed on the fin active area 23. The buffer pattern 35 and the mask pattern 37 may form a hard mask pattern. The preliminary gate structure 38 may include the preliminary dielectric layer 31, the preliminary gate electrode 33, the buffer pattern 35, and the mask pattern 37. For the formation of the preliminary gate structure 38, a plurality of thin film formation processes, a chemical mechanical polishing (CMP) process, an etch-back process, a patterning process, and/or a combination thereof may be performed.

The preliminary gate electrode 33 may cross the fin active area 23. The preliminary gate electrode 33 may cover the side surfaces and the upper surface of the fin active area 23. A lower surface of the preliminary gate electrode 33 located on the isolation layer 29 may be at a lower level than the upper surface of the fin active area 23. The preliminary dielectric layer 31 may be formed between the fin active area 23 and the preliminary gate electrode 33. The preliminary dielectric layer 31 may include an insulating layer such as silicon oxide, silicon nitride, silicon oxynitride, or a combination thereof. The preliminary gate electrode 33 may include poly-silicon.

The buffer pattern 35 may include silicon oxide. The mask pattern 37 may include silicon nitride. The mask pattern 37 may be formed on the preliminary gate electrode 33. The buffer pattern 35 may be formed between the mask pattern 37 and the preliminary gate electrode 33. The preliminary gate electrode 33 may be aligned with the mask pattern 37.

Figure 7:
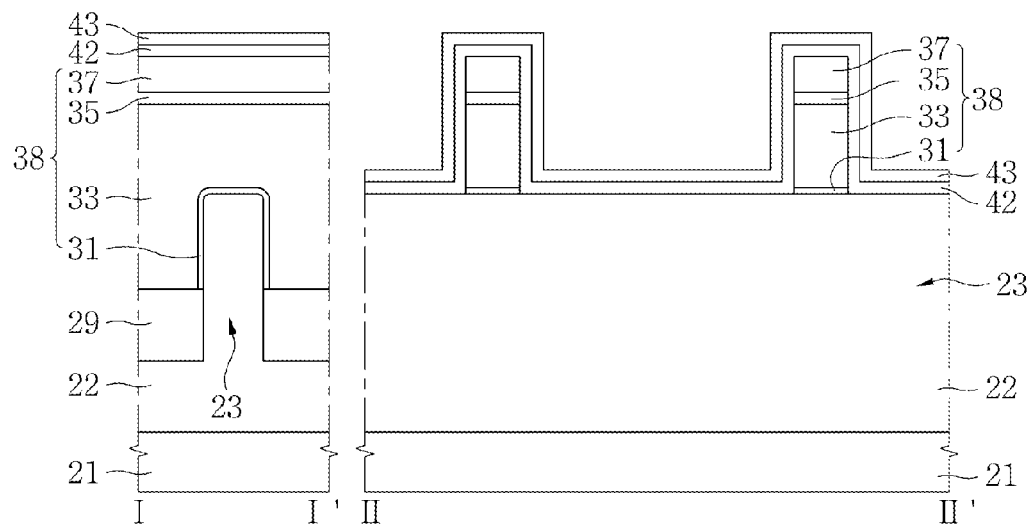

Referring to FIGS. 1, 2, and 7, an inner spacer 42 and an intermediate spacer 43 may be sequentially formed on side surfaces of the preliminary gate structure 38.

Figure 8:
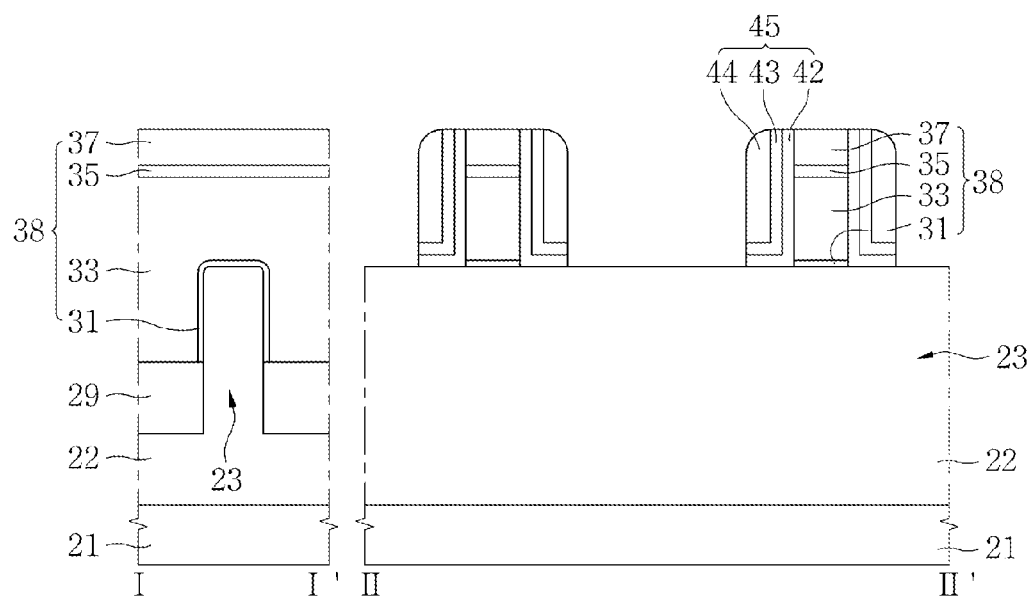

Referring to FIGS. 1, 2, and 8, an outer spacer 44 may be formed on the intermediate spacer 43. The inner spacer 42, the intermediate spacer 43, and the outer spacer 44 may be included in a spacer 45. The plurality of thin film formation processes and anisotropic etching processes may be applied to the formation of the spacer 45. The spacer 45 may cover the side surfaces of the preliminary gate structure 38. The upper surface of the fin active area 23 may be exposed outside the spacer 45. The spacer 45 may include an insulating layer such as silicon oxide, silicon nitride, silicon oxynitride, or a combination thereof. For example, the spacer 45 may include silicon nitride.

Figure 9:
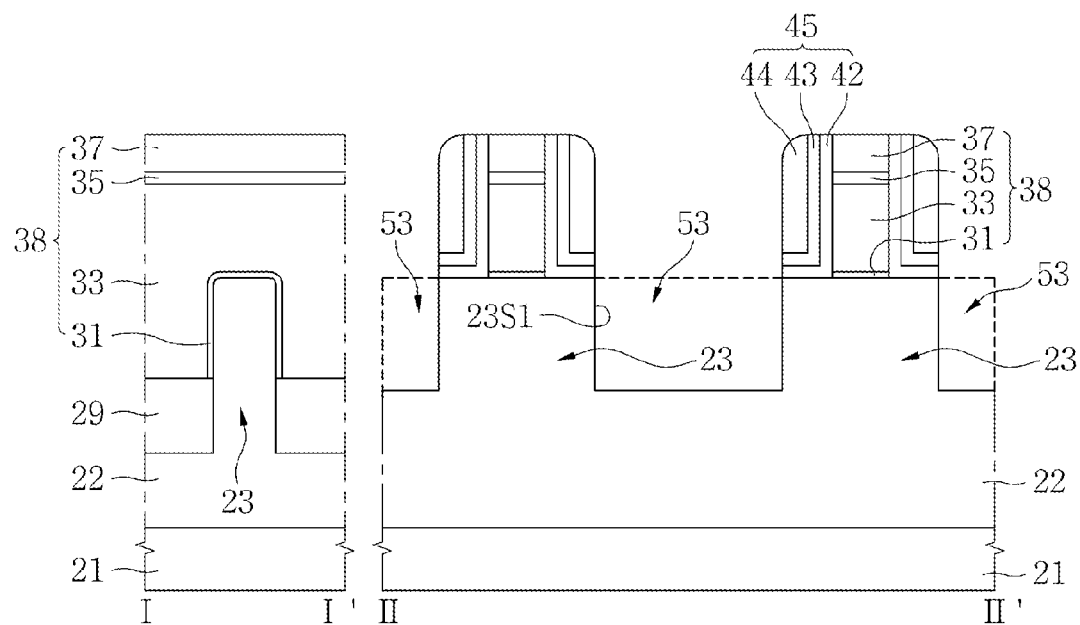

Referring to FIGS. 1, 2, and 9, preliminary trenches 53 may be formed by etching the fin active area 23 (S510). A first surface 23S1 of the fin active area 23 may be exposed to sidewalls and a bottom of the preliminary trench 53.

The anisotropic etching process may be performed to form the preliminary trenches 53. For example, the anisotropic etching process in which the mask pattern 37 and the spacer 45 are used as an etch mask, and HBr, $CF_4$, $O_2$, $Cl_2$, $NF_3$, or a combination thereof is used as an etchant, may be performed to form the preliminary trenches 53. Each of the preliminary trenches 53 may have a U-shape. The sidewalls of the preliminary trenches 53 may have a substantially perpendicular profile with respect to the surface of the substrate 21. The sidewalls of the preliminary trenches 53 may be vertically aligned with outside surfaces of the spacers 45. The sidewalls of the preliminary trenches 53 may be substantially coplanar with the outside surfaces of the spacers 45.

Figure 10:
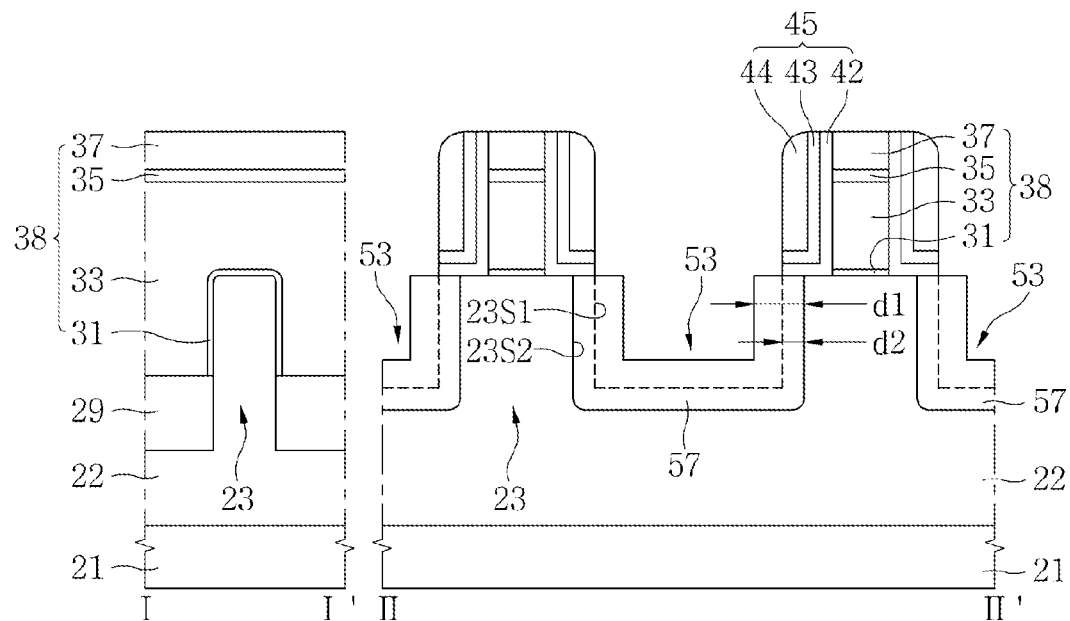

Referring to FIGS. 1, 2, and 10, first etching select areas 57 may be formed in the preliminary trenches 53 (S520). An oxidation process may be used in the formation of the first etching select areas 57.

For example, a radical oxidation process may be used in the formation of the first etching select areas 57. The radical oxidation process may be performed at a temperature of 300° C. to 1200° C. The first surface 23S1 of the fin active area 23 may be oxidized while the radical oxidation process is performed. It may be understood that a part of the fin active area 23 including Si may be oxidized by the radical oxidation process. The first etching select areas 57 may include silicon oxide. The first etching select areas 57 may extend into the preliminary trenches 53.

Each of the first etching select areas 57 may have a first thickness d1. A second surface 23S2 may be formed between the first etching select areas 57 and the fin active area 23. The second surface 23S2 may further extend into the fin active area 23 than the first surface 23S1. A distance between the first surface 23S1 and the second surface 23S2 may be a second thickness d2. For example, the first thickness d1 may be 10 nm to 20 nm. The second thickness d2 may be about 0.44 times of the first thickness d1. The radical oxidation process may have very uniform oxidation characteristics regardless of a crystal orientation of the fin active area 23. The second thickness d2 may be very uniformly formed on the entire surface of the substrate 21. The first surface 23S1 and the second surface 23S2 may be interpreted as substantially parallel to each other.

Figure 11:
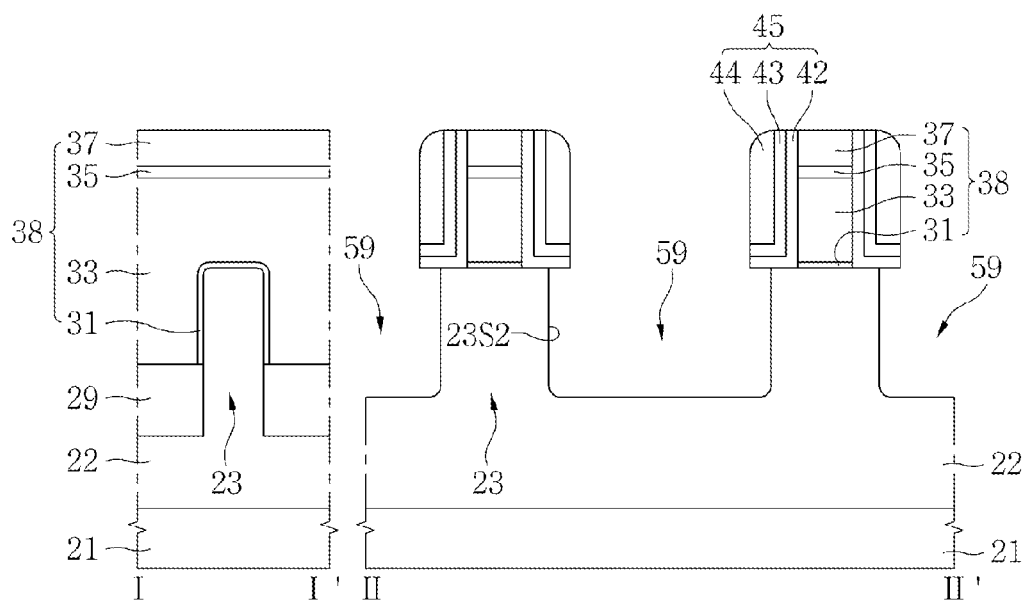

Referring to FIGS. 1, 2, and 11, trenches 59 may be formed by removing the first etching select areas 57 (S530). An isotropic etching process, such as a wet etching process, a dry etching process, or a combination thereof, may be applied to the removal of the first etching select areas 57.

For example, the wet etching process may be performed for the removal of the first etching select areas 57. Sidewalls of the trenches 59 may be arranged under the spacers 45. The sidewalls of the trenches 59 may have a substantially perpendicular profile with respect to the surface of the substrate 21. Bottom surfaces of the trenches 59 may be at a lower level than the lower surface of the preliminary gate electrode 33. The trenches 59 may be interpreted as a case in which the preliminary trenches 53 uniformly extend.

In some embodiments, the sidewalls of the trenches 59 may be aligned with the side surfaces of the preliminary gate electrode 33 or arranged under the preliminary gate electrode 33.

Figure 12:
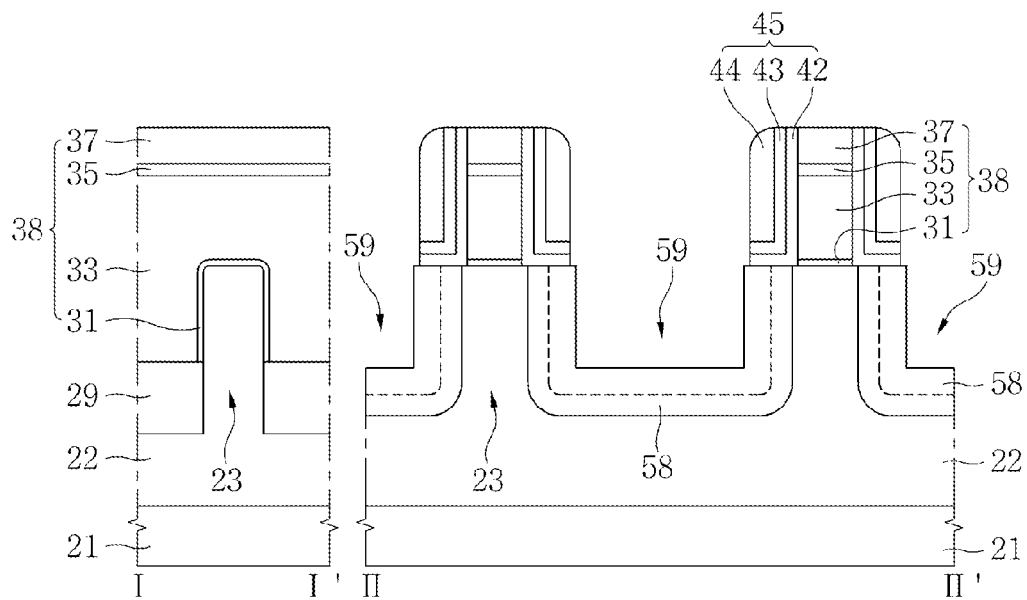

Referring to FIGS. 1, 2, and 12, second etching select areas 58 may be formed in the trenches 59. The oxidation process may be used in the formation of the second etching select areas 58. For example, the radical oxidation process may be used in the formation of the second etching select areas 58.

Figure 13:
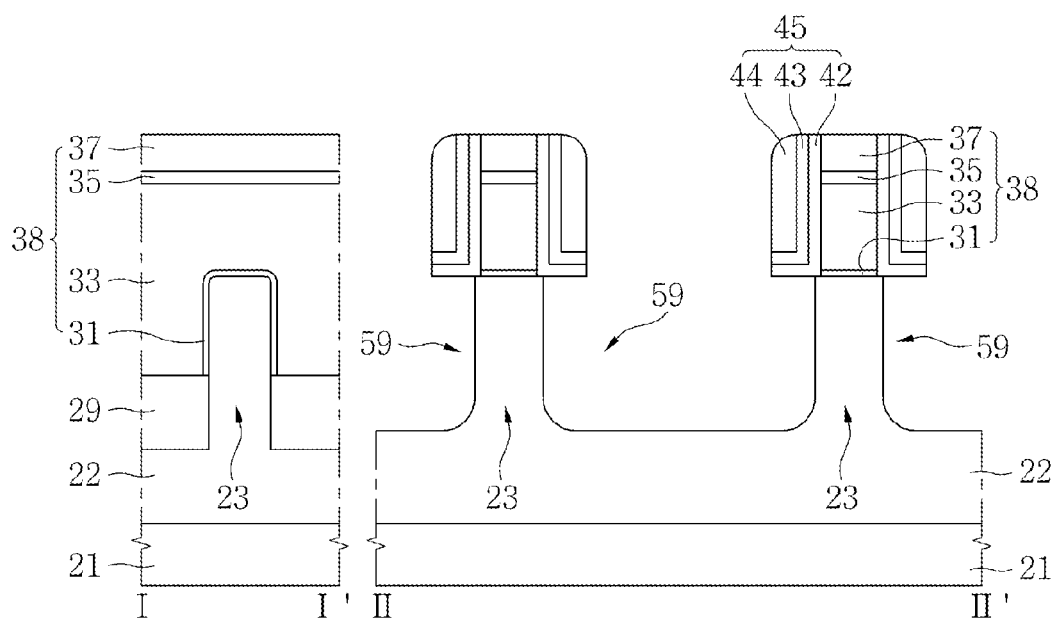
Figure 14:
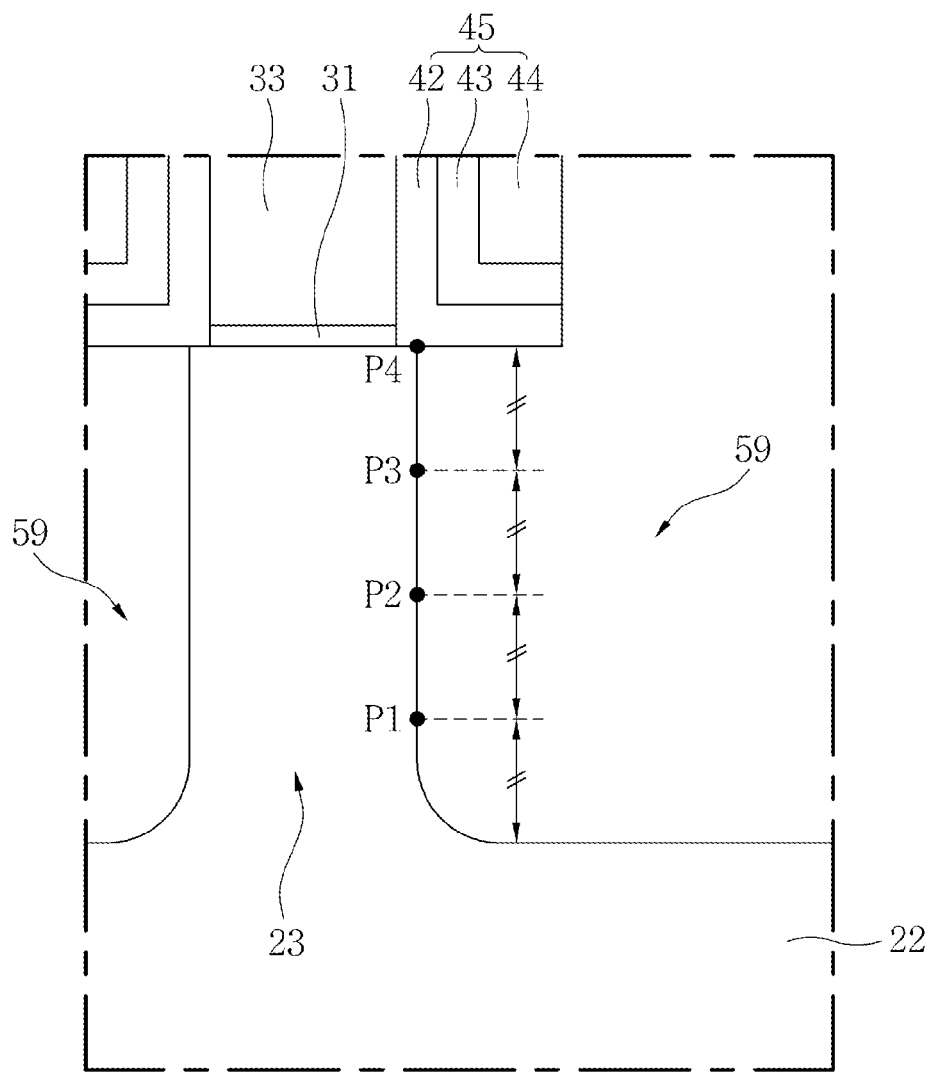
FIG. 14 is an enlarged view showing a part of FIG. 13 in detail.

Referring to FIGS. 1, 2, and 13, the trenches 59 may extend by removing the second etching select areas 58 (S530). An isotropic etching process, such as a wet etching process, a dry etching process, or a combination thereof, may be applied to the removal of the second etching select areas 58. The bottom surfaces of the trenches 59 may be at a lower level than the lower surface of the preliminary gate electrode 33, and at a higher level than a lower surface of the isolation layer 29.

In some embodiments, the formation and removal of the second etching select areas 58 may be omitted.

In some embodiments, the second etching select areas 58 are removed, and then a process, in which third etching select areas are formed and the third etching select areas are removed, may be alternately repeated.

Referring to FIG. 14, when one of the sidewalls of the trenches 59 is selected, and first to fourth quadrant points P1, P2, P3, and P4 are defined on the selected sidewall thereof, the fourth quadrant point P4 may be located on an upper corner of the fin active area 23, the second quadrant point P2 may be located on a horizontal line passing through a vertical bisection point between a bottom and an upper end of the trench 59, the third quadrant point P3 may be located between the second quadrant point P2 and the fourth quadrant point P4, and the first quadrant point P1 may be located between the bottom of the trench 59 and the second quadrant point P2.

A straight line passing through the second quadrant point P2 and the third quadrant point P3 may be substantially perpendicular to the surface of the substrate 21. The fourth quadrant point P4 may be located on the straight line passing through the second quadrant point P2 and the third quadrant point P3. The first to fourth quadrant points P1, P2, P3, and P4 may be located on a straight line.

Figure 15:
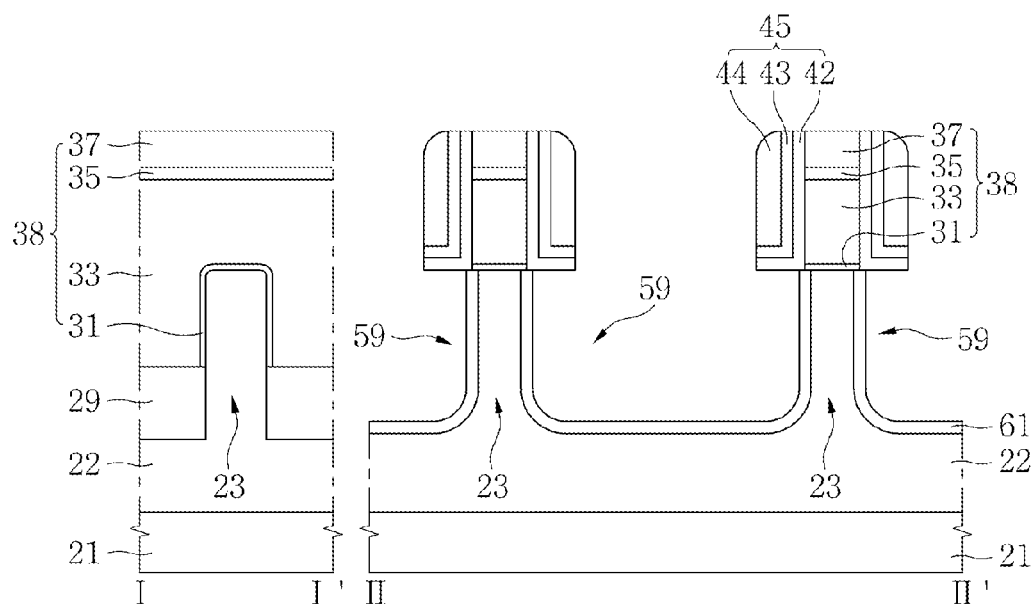

Referring to FIGS. 1, 2, and 15, lightly doped drains (LDDs) 61 may be formed in the fin active area 23 exposed in the trenches 59 using an ion implantation process. For example, the fin active area 23 may include arsenic (As) or phosphorus (P), and the LDDs 61 may be formed by implanting boron (B) into the fin active area 23. The LDDs 61 may have a uniform thickness with respect to inner walls of the trenches 59.

In some embodiments, the LDDs 61 may be omitted.

Figure 16:
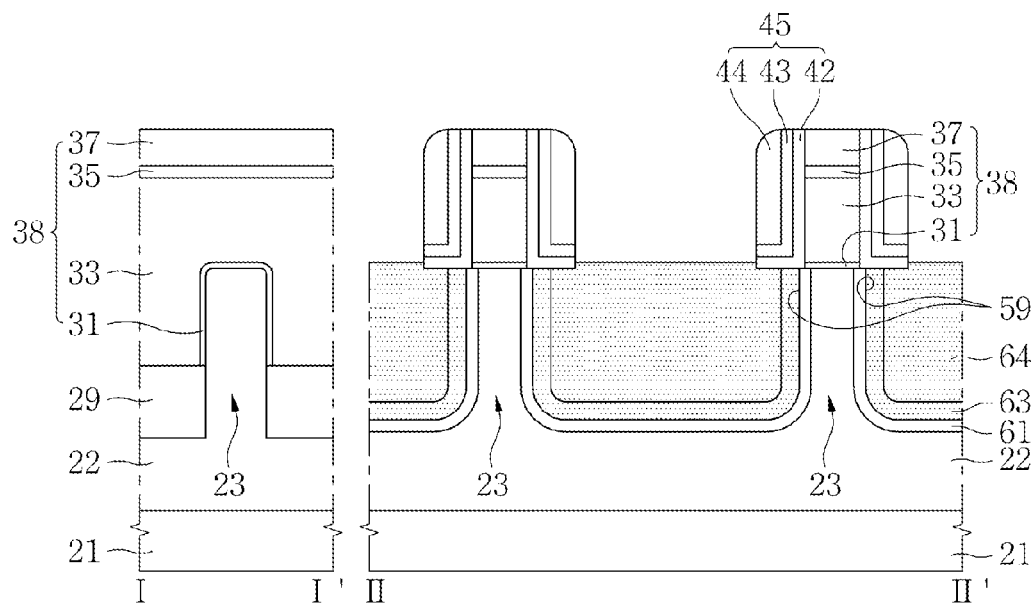

Referring to FIGS. 1, 2, and 16, a first semiconductor layer 63 may be formed in the trenches 59. A second semiconductor layer 64 may be formed on the first semiconductor layer 63.

The first semiconductor layer 63 may include boron (B)-doped single crystalline SiGe formed by a selective epitaxial growth (SEG) method. The Ge content in the first semiconductor layer 63 may be 10 to 25%. The Boron (B) concentration in the first semiconductor layer 63 may be greater than that in the LDDs 61. The first semiconductor layer 63 may conformally cover the inner walls of the trenches 59.

The second semiconductor layer 64 may include boron (B)-doped single crystalline SiGe formed by the SEG method. The Ge content in the second semiconductor layer 64 may be greater than that in the first semiconductor layer 63. The Ge content in the second semiconductor layer 64 may be 25 to 50%. The B concentration in the second semiconductor layer 64 may be greater than that in the LDDs 61. The concentration of boron (B) in the second semiconductor layer 64 may range from about 1E20 to about 3E20 atoms/cm$^3$. The second semiconductor layer 64 may fully fill the trenches 59. An upper surface of the second semiconductor layer 64 may at a higher level than the upper surface of the fin active area 23.

Figure 17:
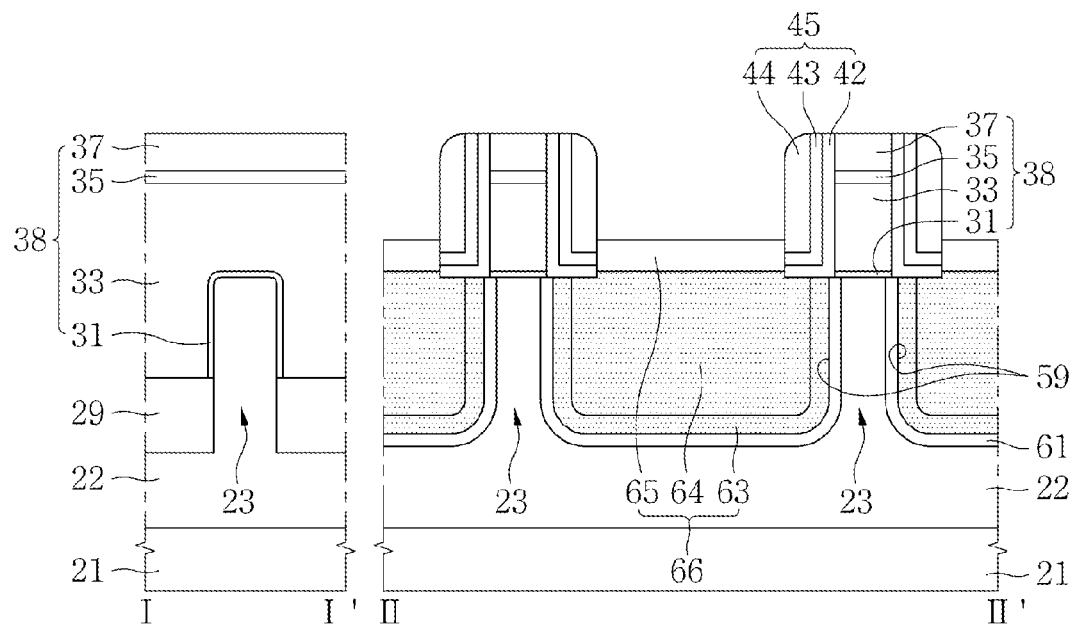

Referring to FIGS. 1, 2, and 17, a third semiconductor layer 65 may be formed on the second semiconductor layer 64. The first semiconductor layer 63, the second semiconductor layer 64, and the third semiconductor layer 65 may form a stressor 66 (S540). Sidewalls of the stressor 66 may arranged under the gate spacer 38, and have a substantially vertical profile the same as sidewalls of the trench 59. In other words, sidewalls of the stressor 66 may have a substantially perpendicular profile with respect to the surface of the substrate 21.

The third semiconductor layer 65 may include boron (B)-doped single crystalline Si formed by the SEG method. The concentration of boron (B) in the third semiconductor layer 65 may range from about 1E20 to about 3E20 atoms/cm$^3$.

In some embodiments, the first semiconductor layer 63 or the third semiconductor layer 65 may be omitted.

The stressor 66 may be referred to as an embedded stressor or a strain-inducing pattern.

Figure 18:
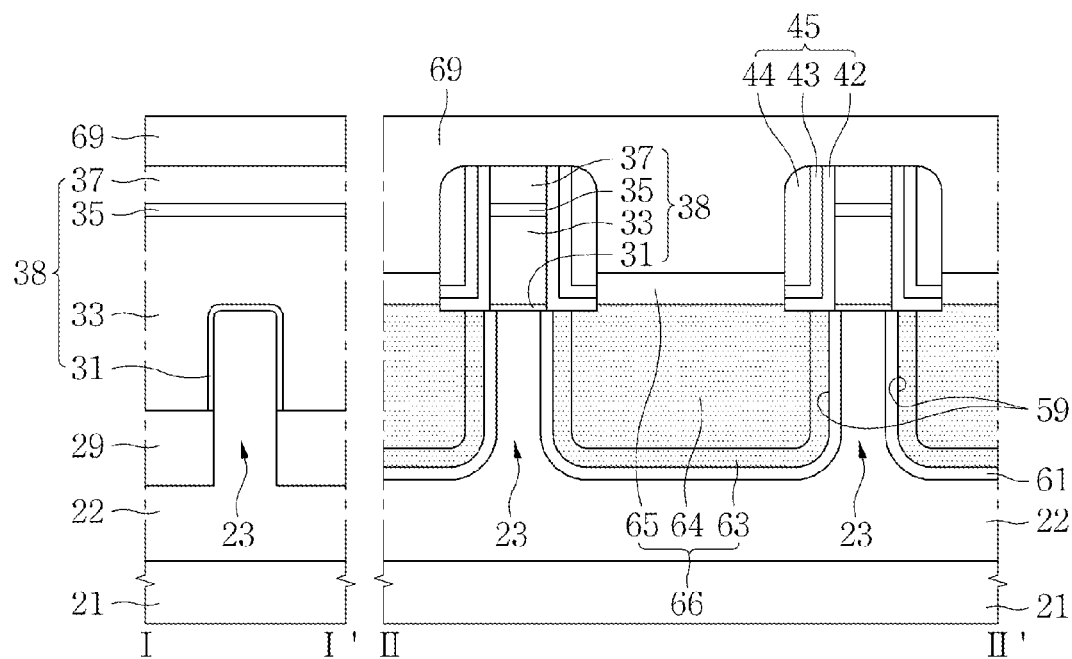

Referring to FIGS. 1, 2, and 18, an interlayer insulating layer 69 may be formed on the substrate 21. The interlayer insulating layer 69 may include an insulating layer such as silicon oxide, silicon nitride, silicon oxynitride, or a combination thereof.

Figure 19:
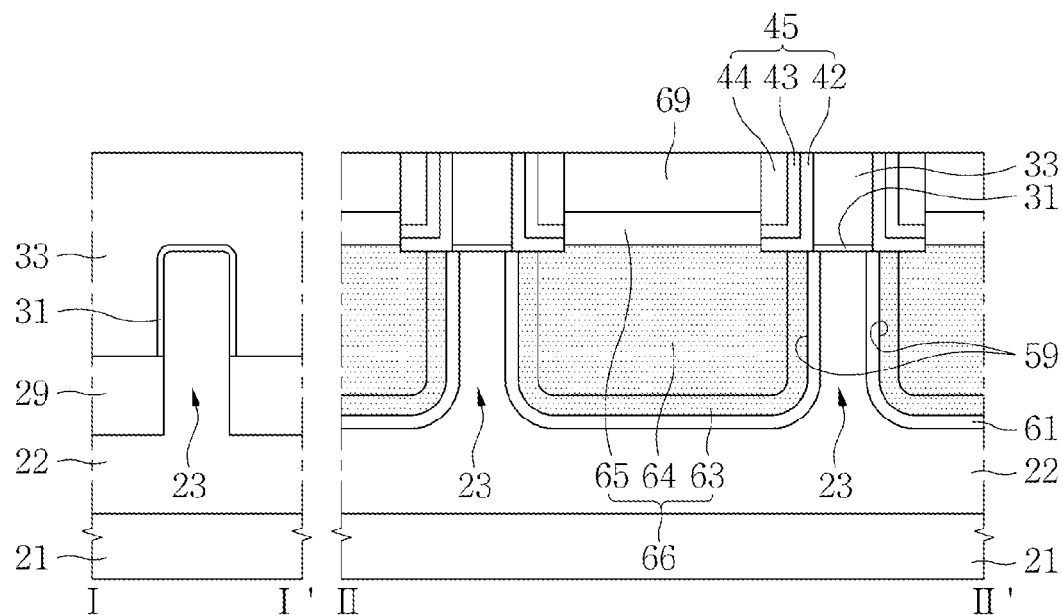

Referring to FIGS. 1, 2, and 19, the interlayer insulating layer 69 and the spacer 45 may be partially removed, the mask pattern 37 and the buffer pattern 35 may be removed, and then the preliminary gate electrode 33 may be exposed. A chemical mechanical polishing (CMP) process, an etch-back process, or a combination thereof may be applied to the removal of the interlayer insulating layer 69, the spacer 45, the mask pattern 37, and the buffer pattern 35.

Figure 20:
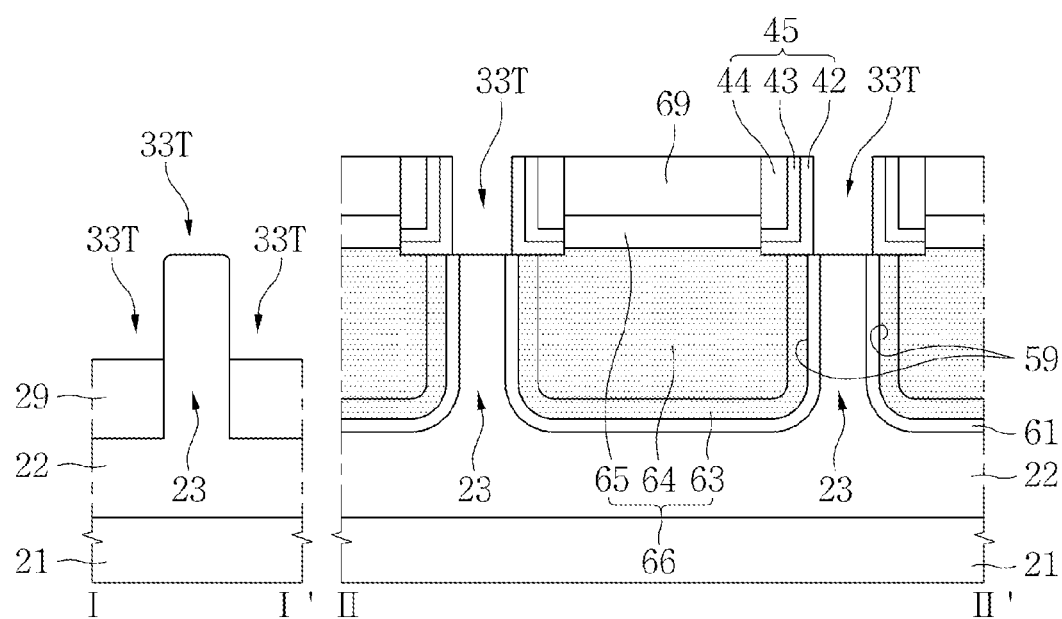

Referring to FIGS. 1, 2, and 20, a gate trench 33T, which exposes the fin active area 23, may be formed by removing the preliminary gate electrode 33 and the preliminary dielectric layer 31. The upper surface and side surfaces of the fin active area 23 may be exposed in the gate trench 33T.

Figure 21:
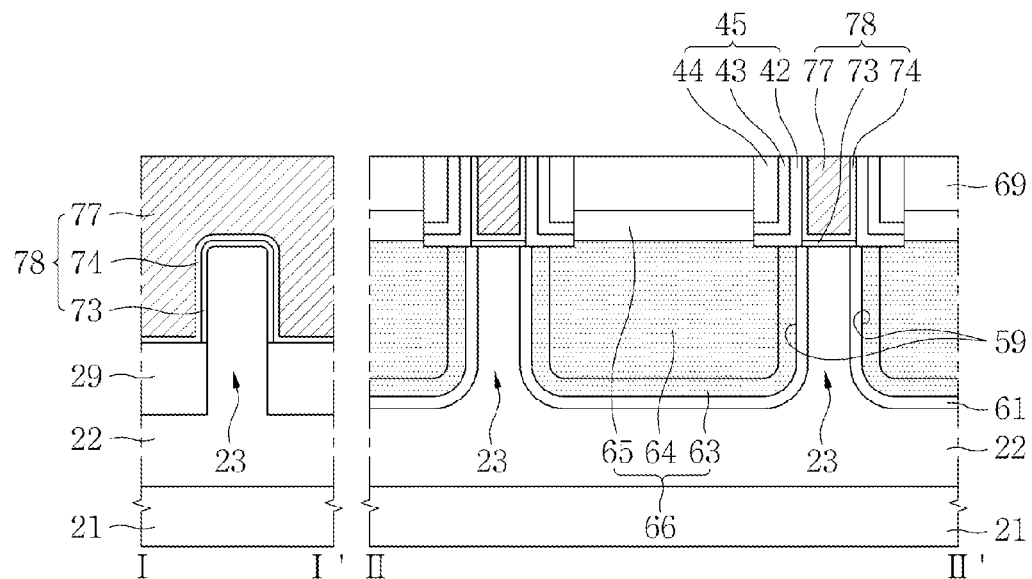

Referring to FIGS. 1, 2, and 21, a first gate dielectric layer 73, a second gate dielectric layer 74, and a gate electrode 77 may be formed in the gate trench 33T.

The first gate dielectric layer 73 may be formed in the fin active area 23. The first gate dielectric layer 73 may be referred to as an interfacial oxide layer. The first gate dielectric layer 73 may be formed using a cleaning process. The first gate dielectric layer 73 may include silicon oxide. The first gate dielectric layer 73 may be in contact with the upper surface and the side surfaces of the fin active area 23. The second gate dielectric layer 74 may include silicon oxide, silicon nitride, silicon oxynitride, a high-k dielectric layer, or a combination thereof. The second gate dielectric layer 74 may cover side surfaces and a bottom of the gate electrode 77. The first gate dielectric layer 73 may be interposed between the fin active area 23 and the second gate dielectric layer 74. A thin film formation process and a planarization process may be applied to the formation of the gate electrode 77. The gate electrode 77 may cover the upper surface and the side surfaces of the fin active area 23. The gate electrode 77 may include a conductive layer such as Ti, TiN, TiAl, TiAlC, Ta, TaN, W, WN, or a combination thereof.

The first gate dielectric layer 73, the second gate dielectric layer 74, and the gate electrode 77 may be included in a gate structure 78.

Referring to FIGS. 1, 2, and 22, the fin active area 23 may be retained between the stressors 66. The gate electrode 77 may cover the upper surface and the side surfaces of the fin active area 23. A lower surface of the gate electrode 77 located on the isolation layer 29 may be at a lower level than the upper surface of the fin active area 23.

Referring to FIGS. 1, 2, and 23, the trenches 59 may be formed by partially removing the fin active area 23. Each trench 59 may have a U-shape.

Referring to FIGS. 1, 2, and 24, the fin active area 23 may be retained between the stressors 66. The LDDs 61 may be formed between the first semiconductor layer 63 and the fin active area 23. The gate electrode 77 may face the side surfaces of the fin active area 23. The first gate dielectric layer 73 and the second gate dielectric layer 74 may be interposed between the fin active area 23 and the gate electrode 77.

Figure 25:
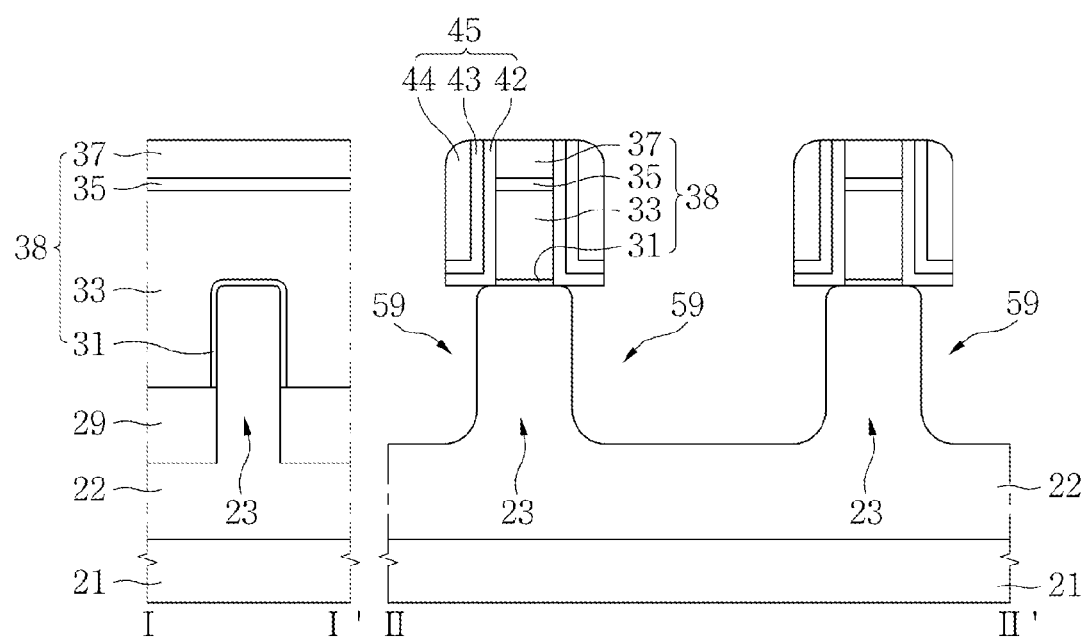
FIGS. 25 and 27 are cross-sectional views taken along lines I-I' and II-II' shown in FIG. 2, and are for describing a method of forming a semiconductor device in accordance with example embodiments of the inventive concept.
Figure 26:
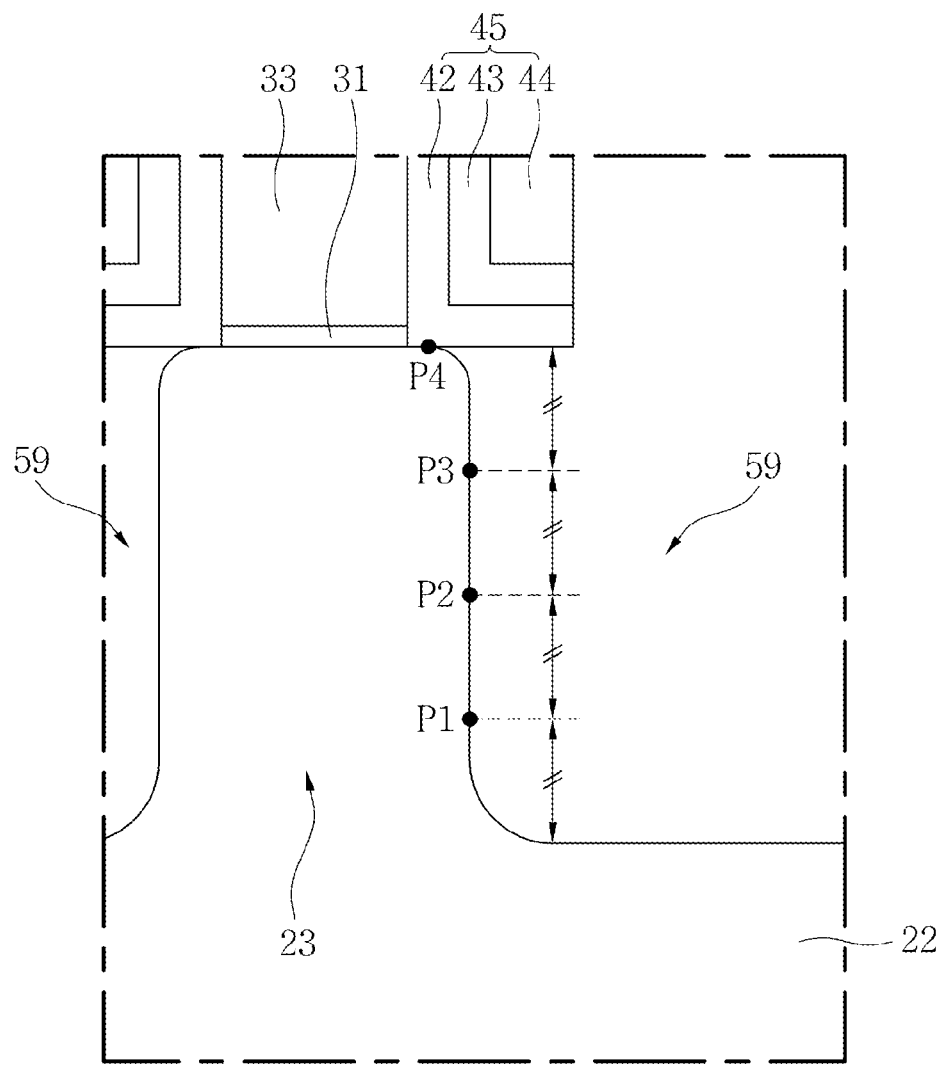
FIG. 26 is an enlarged view showing a part of FIG. 25 in detail.
Figure 27:
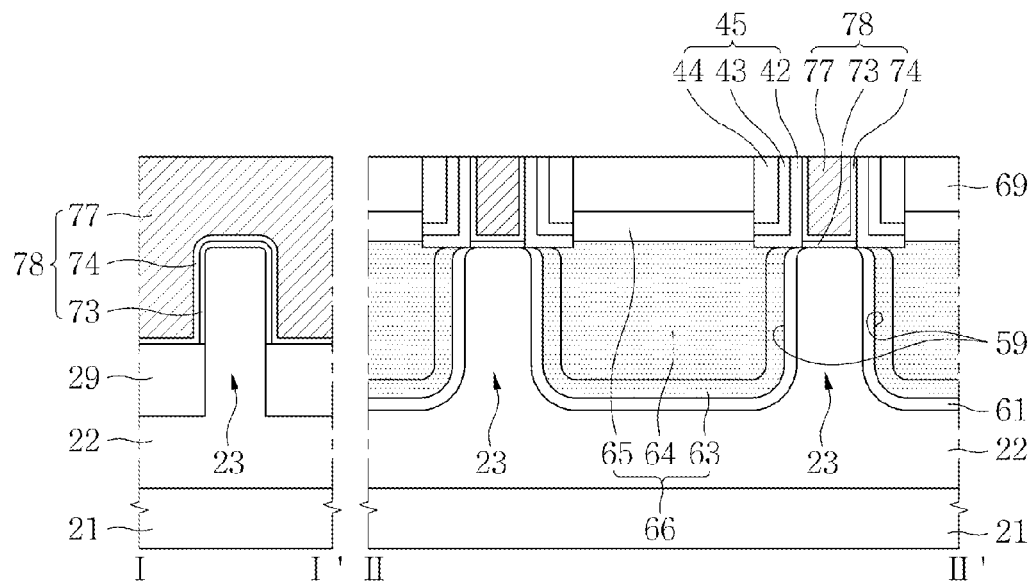

FIGS. 25 and 27 are cross-sectional views taken along lines I-I' and II-II' shown in FIG. 2 for describing a method of forming a semiconductor device in accordance with example embodiments of the inventive concept. FIG. 26 is an enlarged view showing a part of FIG. 25 in detail.

Referring to FIGS. 2 and 25, the trenches 59 may have various shapes. Upper areas of the trenches 59 may have greater widths than intermediate areas of the trenches 59.

After the preliminary trenches 53 described with reference to FIG. 9 are formed, the trenches 59 may be formed by forming the first etching select areas 57 described with reference to FIG. 10 in the preliminary trenches 53 using a thermal oxidation process as a substitute for the radical oxidation process and removing the first etching select areas 57. As a result, under-cut areas corresponding to the upper areas of the trenches 59 may be formed under the spacer 45. Upper corners of the fin active area 23 may be roundly formed. The thermal oxidation process may be performed at a temperature of 700° C. to 1300° C. The fin active area 23 may be exposed in the trenches 59.

Referring to FIG. 26, a straight line passing through a second quadrant point P2 and a third quadrant point P3 may be substantially perpendicular to the surface of the substrate 21. A fourth quadrant point P4 may be formed on a different location from the straight line passing through the second quadrant point P2 and the third quadrant point P3. The straight line passing through the second quadrant point P2 and the third quadrant point P3 may be arranged outside the preliminary gate electrode 33. The fourth quadrant point P4 may be arranged under the preliminary gate electrode 33.

In some embodiments, the straight line passing through the second quadrant point P2 and the third quadrant point P3 may be arranged under the preliminary gate electrode 33. The fourth quadrant point P4 may be arranged nearer a center of the preliminary gate electrode 33 than the straight line passing through the second quadrant point P2 and the third quadrant point P3.

Referring to FIGS. 2 and 27, LDDs 61 may have a uniform thickness with respect to inner walls of the trenches 59. The LDDs 61 may be parallel to the inner walls of the trenches 59.

Figure 28:
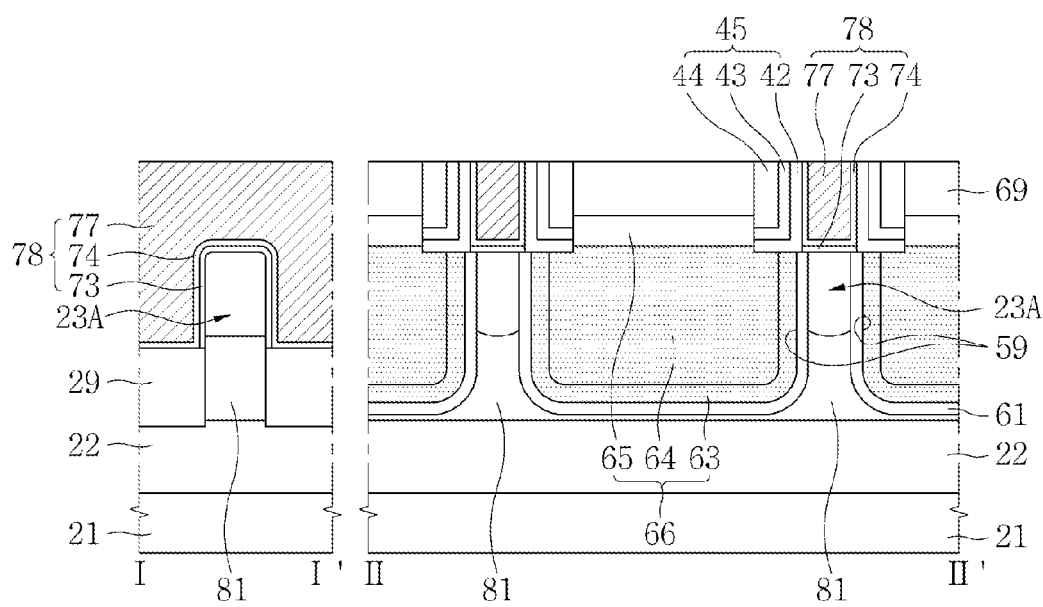
FIG. 28 is a cross-sectional view taken along lines I-I' and II-II' shown in FIG. 2, and is for describing a method of forming a semiconductor device in accordance with example embodiments of the inventive concept.

FIG. 28 is a cross-sectional view taken along lines I-I' and II-II' shown in FIG. 2 for describing a method of forming a semiconductor device in accordance with example embodiments of the inventive concept.

Referring to FIGS. 2 and 28, halos 81 may be formed in the fin active area 23.

The halos 81 may cover bottoms of the LDDs 61, and side surfaces of the LDDs 61. The halos 81 may include different conductive impurities from the LDDs 61, and the same conductive impurities as an N-well 22. For example, the halos 81 may include N-type impurities. The halos 81 may have a greater N-type impurity concentration than the N-well 22. The halos 81 may cover the stressors 66. The halos 81 may cover a lower area of the stressors 66.

Figure 29:
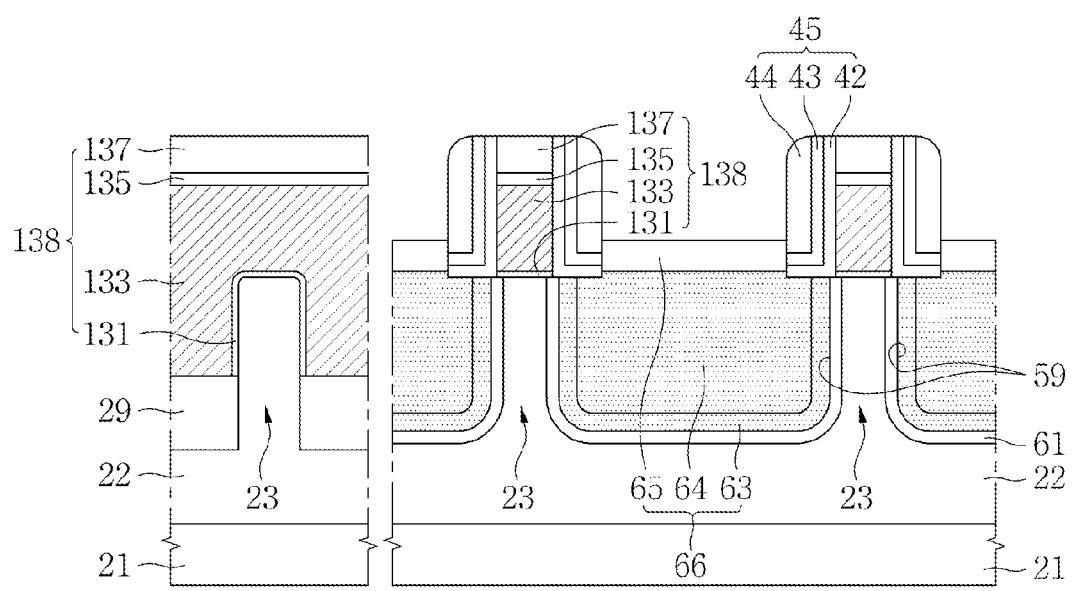
FIG. 29 is a cross-sectional view for describing a method of forming a semiconductor device in accordance with example embodiments of the inventive concept.

FIG. 29 is a cross-sectional view for describing a method of forming a semiconductor device in accordance with example embodiments of the inventive concept.

Referring to FIG. 29, a gate structure 138 may be formed on a fin active area 23 without formation of a preliminary gate structure 38 and a replacement process for forming a gate structure 78 described with reference to FIGS. 1 to 21. As a result, a trench 59 and a stressor 66 described with reference to FIGS. 1 to 17 may be formed adjacent to the gate structure 138. The gate structure 138 may include a gate dielectric layer 131, a gate electrode 133, a buffer pattern 135, and a mask pattern 137, which are formed on the fin active area 23. Spacers 45 may be formed on side surfaces of the gate structure 138.

Figure 30:
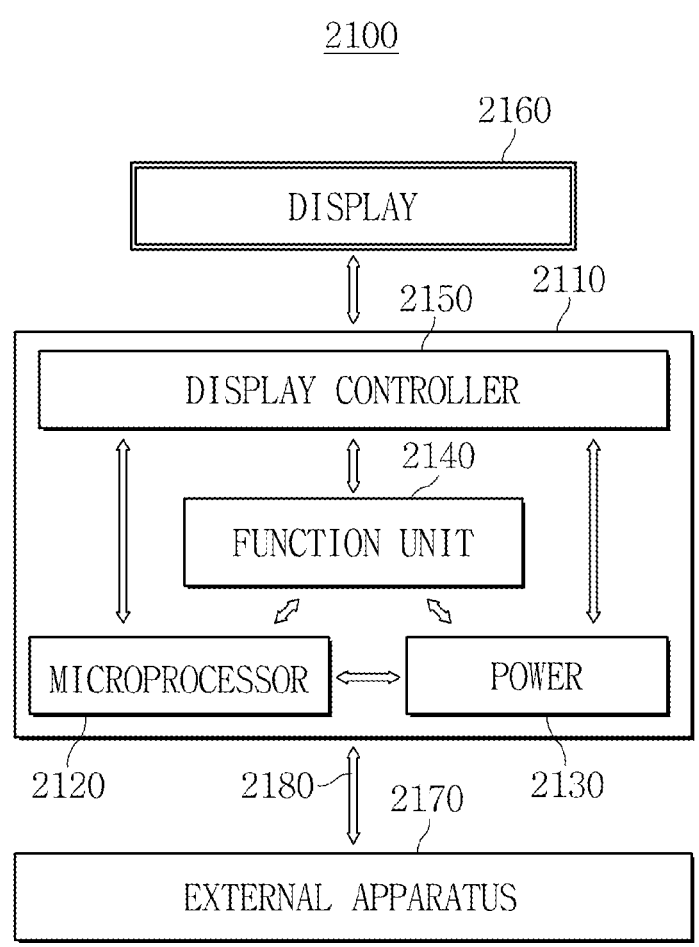
FIG. 30 is a system block diagram of electronic system in accordance with example embodiments of the inventive concept.

FIG. 30 is a system block diagram of electronic system in accordance with example embodiments of the inventive concept.

Referring to FIG. 30, a semiconductor device according to example embodiments of the inventive concept may be applied to an electronic system 2100. The electronic system 2100 may include a body 2110, a microprocessor 2120, a power unit 2130, a function unit 2140, and a display controller 2150. The body 2110 may be a motherboard formed of a printed circuit board (PCB). The microprocessor 2120, the power unit 2130, the function unit 2140, and the display controller 2150 may be mounted on the body 2110. A display unit 2160 may be disposed inside the body 2110 or outside the body 2110. For example, the display unit 2160 may be disposed on a surface of the body 2110, and display an image processed by the display controller 2150.

The power unit 2130 may receive a constant voltage from an external battery (not shown), divide the voltage into required voltage levels, and supply the voltages to the microprocessor 2120, the function unit 2140, the display controller 2150, and so on. The microprocessor 2120, may receive the voltage from the power unit 2130, and control the function unit 2140 and the display unit 2160. The function unit 2140 may perform various functions of the electronic system 2100. For example, when the electronic system 2100 is a smart phone, the function unit 2140 may include various components to perform phone functions such as dialing, image output to the display unit 2160 or voice output to a speaker through communication with an external device 2170, and so on, and when a camera is mounted together, it may serve as a camera image processor.

In an application embodiment, when the electronic system 2100 is connected to a memory card to expand the capacity, the function unit 2140 may be a memory card controller. The function unit 2140 may exchange signals with the external device 2170 through a wired or wireless communication unit 2180. When the electronic system 2100 requires a Universal Serial Bus (USB) to extend the functions, the function unit 2140 may serve as an interface controller. The function unit 2140 may include a mass storage device.

A semiconductor device according to example embodiments of the inventive concept may be applied to the function unit 2140 or the microprocessor 2120.

In accordance with embodiments of the inventive concept, a preliminary trench may be formed in a fin active area using an anisotropic etching process. An etching select area may be formed in the preliminary trench using a radical oxidation process. A trench may be formed by removing the etching select area. A stressor may be formed in the trench. A sidewall of the trench may have a vertical profile. A distance between a gate electrode and the stressor may be controlled to be very uniform. Si displacement caused by the anisotropic etching process may occur on inner walls of the preliminary trench, however, the Si displacement can be removed by the radical oxidation process and removing the etching select area. Therefore, since crystal defects of the stressor can be reduced, a semiconductor device having excellent electrical characteristics can be implemented.

The foregoing is illustrative of embodiments of the inventive concept and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device, comprising:
   forming a fin at an upper portion of a substrate, the fin extending longitudinally in a first direction;
   forming a gate structure that extends across the fin in a second direction and covers a side surface of the fin, and a gate spacer on sides of the gate structure;
   forming trenches in the fin spaced from each other along the fin in the first direction; and
   forming stressors in the trenches, respectively, such that the stressors are embedded in and stress the fin,
   wherein the forming of the trenches includes forming preliminary trenches by anisotropically etching the fin, forming an etching select area by oxidizing portions of the fin exposed by the preliminary trenches, and removing the etching select area, and
   the trenches are located near the gate structure on opposite sides of the gate structure, respectively.

2. The method according to claim 1, wherein the forming of the etching select area includes a radical oxidation process.

3. The method according to claim 1, wherein the forming of the trenches includes forming the preliminary trenches by anisotropically etching the fin, and then performing a process of forming the etching select area in the fin and a process of removing the etching select area two or more times.

4. The method according to claim 1, wherein each of the trenches has a U-shaped cross section in a plane extending in the first direction perpendicular to an upper surface of the substrate.

5. The method according to claim 1, further comprising:
   forming halo areas in the fin adjacent the stressors.

6. The method according to claim 1, wherein the trenches are formed such that respective sides thereof lie under the gate spacer, and said sides of the trenches each have a substantially vertical profile.

7. The method according to claim 1, wherein for each of said respective sides of the trenches, first to fourth quadrant points lie along the side of the trench, the fourth quadrant point is located on an upper corner of the fin, the second quadrant point is located on a horizontal line bisecting the trench in its depth-wise direction so as to pass through a point midway between bottom and top of the trench, and a straight line passing through the second quadrant point and the third quadrant point is substantially perpendicular to an upper surface of the substrate.

8. The method according to claim 7, wherein the fourth quadrant point is located on a straight line passing through the second quadrant point and the third quadrant point.

9. The method according to claim 7, wherein the fourth quadrant point is spaced apart from a straight line passing through the second quadrant point and the third quadrant point, and
   the fourth quadrant point is closer to a plane perpendicular to an upper surface of the substrate, and passing through a center of the gate structure in the first direction, than the second quadrant point and the third quadrant point.

10. The method according to claim 1, wherein the forming of the stressors comprises:
    forming a first semiconductor layer in the trenches;
    forming a second semiconductor layer on the first semiconductor layer, and
    forming a third semiconductor layer on the second semiconductor layer, wherein the first semiconductor layer and the second semiconductor layer include a different material from the fin.

11. The method according to claim 10, wherein the first semiconductor layer, the second semiconductor layer, and the third semiconductor layer are formed by a selective epitaxial growth (SEG) method.

12. The method according to claim 11, wherein each of the first semiconductor layer and the second semiconductor layer include SiGe, a Ge content in the second semiconductor layer is greater than that in the first semiconductor layer, and the third semiconductor layer includes Si.

13. The method according to claim 12, wherein the forming of the etching select area includes a thermal oxidation process.

14. A method of forming a semiconductor device, comprising:
   forming an isolation structure that delimits an active area at an upper portion of a substrate;
   forming a gate structure that crosses the active area;
   forming trenches in the active area; and
   forming stressors in the trenches, respectively, such that the stressors are embedded in and stress the active area,
   wherein the forming of the trenches includes forming preliminary trenches by anisotropically etching the active area, forming an etching select area in the preliminary trenches by oxidizing the active area using a radical oxidation process, and removing the etching select area, and
   the trenches are located near the gate structure on opposite sides of the gate structure, respectively.

15. The method according to claim 14, wherein the trenches are formed such that sides of the trenches have a profile substantially perpendicular to an upper surface of the substrate.

16. The method according to claim 14, wherein the forming of the trenches includes forming the preliminary trenches by anisotropically etching the active area, and then performing a process of forming the etching select area in the active area by the radical oxidation process and a process of removing the etching select area two or more times.

17. The method according to claim 14, wherein each of the trenches has a U-shaped cross section in a plane extending in the first direction perpendicular to an upper surface of the substrate.

18. A method of forming a semiconductor device, comprising:
   forming a fin at an upper portion of a substrate, the fin extending longitudinally in a first direction;
   forming gate structures extending across portions of the fin, respectively, and a respective gate spacer on sides of each of the gate structures;
   forming preliminary trenches in the fin spaced from each other along the fin in the first direction;
   forming trenches by performing a process one or more times, the process including forming an etching select area in the preliminary trenches by oxidizing the fin active area using a radical oxidation process and removing the etching select area; and
   forming a stressor by selective epitaxial growth method in each of the trenches, respectively, such that the stressors are embedded in and stress the fin, and
   wherein the forming of the gate structures comprises forming mask patterns on the fin as spaced from each other in the first direction,
   the forming of the preliminary trenches includes forming a respective preliminary trench in a region of the fin located between respective ones of the mask patterns adjacent one another in the first direction by using the mask patterns as an etch mask, and
   the forming of the trenches and the gate structures are sequenced such that the trenches of a respective pair thereof are located near each of the gate structures on opposite sides of the gate structure, respectively.

19. The method according to claim 18, wherein the trenches are formed such that sides of the trenches have a profile substantially perpendicular to an upper surface of the substrate.

20. The method according to claim 18, wherein the stressors are formed such that side surfaces of the stressors have a profile substantially perpendicular to an upper surface of the substrate.

* * * * *